(12) United States Patent
Ohno et al.

(10) Patent No.: US 12,110,582 B2
(45) Date of Patent: Oct. 8, 2024

(54) INTERFACIAL LAYER FOR OPTICAL FILM PERFORMANCE

(71) Applicants: Kenichi Ohno, Sunnyvale, CA (US); Takashi Kuratomi, San Jose, CA (US); Fariah Hayee, San Jose, CA (US); Andrew Ceballos, Palo Alto, CA (US); Rami Hourani, Santa Clara, CA (US); Ludovic Godet, Sunnyvale, CA (US)

(72) Inventors: Kenichi Ohno, Sunnyvale, CA (US); Takashi Kuratomi, San Jose, CA (US); Fariah Hayee, San Jose, CA (US); Andrew Ceballos, Palo Alto, CA (US); Rami Hourani, Santa Clara, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/698,566

(22) Filed: Mar. 18, 2022

(65) Prior Publication Data
US 2022/0316044 A1 Oct. 6, 2022

Related U.S. Application Data

(60) Provisional application No. 63/165,566, filed on Mar. 24, 2021.

(51) Int. Cl.
C23C 14/35 (2006.01)
C23C 14/08 (2006.01)
C23C 14/34 (2006.01)

(52) U.S. Cl.
CPC ........ *C23C 14/083* (2013.01); *C23C 14/3485* (2013.01); *C23C 14/35* (2013.01)

(58) Field of Classification Search
CPC . C23C 14/0036; C23C 14/35; C23C 14/3485; C23C 14/083
(Continued)

(56) References Cited

U.S. PATENT DOCUMENTS

2003/0077914 A1\* 4/2003 Le ................. H01J 37/3408
438/763
2006/0088688 A1 4/2006 Bellman et al.
(Continued)

FOREIGN PATENT DOCUMENTS

CN 108130522 A 6/2018
CN 109085675 A 12/2018
(Continued)

OTHER PUBLICATIONS

Drogowska et al. "RBS, XRR and optical reflectivity measurements of Ti—TiO2 thin films deposited by magnetron sputtering", Materials Research Bulletin, 47 (2012), 296-301. (Year: 2012).*
(Continued)

*Primary Examiner* — Rodney G McDonald
(74) *Attorney, Agent, or Firm* — Patterson & Sheridan LLP

(57) ABSTRACT

A method of forming an optical device is provided. The method includes disposing an optical device substrate on a substrate support in a process volume of a process chamber, the optical device substrate having a first surface; and forming a first optical layer on the first surface of the optical device substrate during a first time period when the optical device substrate is on the substrate support, wherein the first optical layer comprises one or more metals in a metal-containing oxide, a metal-containing nitride, or a metal-containing oxynitride, and the first optical layer is formed without an RF-generated plasma over the optical device substrate; and forming a second optical layer with an RF-
(Continued)

generated plasma over the first optical layer during a second time period when the optical device substrate is on the substrate support.

20 Claims, 3 Drawing Sheets

(58) Field of Classification Search
USPC .......................... 204/192.26–192.29, 192.15
See application file for complete search history.

(56) References Cited

U.S. PATENT DOCUMENTS

2007/0015304 A1    1/2007  Doan
2010/0075176 A1*  3/2010  Yamada ............. C23C 14/5806
                                                               359/359

FOREIGN PATENT DOCUMENTS

| CN | 109652765 A | * | 4/2019 |
|----|-------------|---|--------|
| CN | 110364583 A |   | 10/2019 |
| KR | 2013-0075920 | * | 7/2013 |

OTHER PUBLICATIONS

Machine Translation of CN 109652765 (Year: 2019).*
Machine Translation of KR 2013-0075920 (Year: 2013).*
International Search Report dated Jul. 8, 2022 for Application No. PCT/US2022/020871.

* cited by examiner

INTERFACIAL LAYER FOR OPTICAL FILM PERFORMANCE

CROSS-REFERENCE TO RELATED APPLICATIONS

This application claims the benefit of U.S. Provisional Patent Application No. 63/165,566, filed on Mar. 24, 2021, the contents of which are herein incorporated by reference.

BACKGROUND

Field

Embodiments of the present disclosure generally relate to optical devices. More specifically, embodiments described herein relate to an optical device layer stack, an optical device formed from the optical device layer stack, and methods of forming an optical device layer stack.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated to appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlaid on an ambient environment. Optical devices including waveguide combiners, such as augmented reality waveguide combiners, and flat optical devices, such as metasurfaces, are used to assist in overlaying images. Generated light is propagated through an optical device until the light exits the optical device and is overlaid on the ambient environment. Despite numerous advances in the field of optical devices and methods used to form optical devices, optical loss and light scattering inside the optical device remain a problem. Optical loss and light scattering lower the optical performance of optical devices and can ultimately give users of the optical devices (e.g., augmented reality devices) an unsatisfactory experience.

Accordingly, what is needed in the art are improved optical devices and methods to form these improved optical devices.

SUMMARY

In one embodiment, a method of forming an optical device is provided. The method includes disposing an optical device substrate on a substrate support in a process volume of a process chamber, the optical device substrate having a first surface; and forming a first optical layer on the first surface of the optical device substrate during a first time period when the optical device substrate is on the substrate support, wherein the first optical layer comprises one or more metals in a metal-containing oxide, a metal-containing nitride, or a metal-containing oxynitride, and the first optical layer is formed without an RF-generated plasma over the optical device substrate; and forming a second optical layer with an RF-generated plasma over the first optical layer during a second time period when the optical device substrate is on the substrate support, wherein the first optical layer is disposed between the optical device substrate and the second optical layer, the second optical layer is spaced apart from the optical device substrate in a first direction, the second optical layer comprises a metal-containing oxide, a metal-containing nitride, or a metal-containing oxynitride, the first optical layer has a thickness in the first direction between an atomic layer and about 10 nm, and the second optical layer has a thickness in the first direction of greater than about 20 nm.

In another embodiment, a method of forming an optical device is provided. The method includes disposing an optical device substrate on a first substrate support in a first process volume of a first process chamber, the optical device substrate having a first surface; forming a first optical layer on the first surface of the optical device substrate during a first time period when the optical device substrate is on the first substrate support in the first process volume, wherein the first optical layer comprises one or more metals in a metal-containing oxide, a metal-containing nitride, or a metal-containing oxynitride, and the first optical layer is formed without an RF-generated plasma over the optical device substrate; disposing the optical device substrate on a second substrate support in a second process volume of a second process chamber; and forming a second optical layer with an RF-generated plasma over the first optical layer during a second time period when the optical device substrate is on the second substrate support, wherein the first optical layer is disposed between the optical device substrate and the second optical layer, the second optical layer is spaced apart from the optical device substrate in a first direction, the second optical layer comprises a metal-containing oxide, a metal-containing nitride, or a metal-containing oxynitride, the first optical layer has a thickness in the first direction between an atomic layer and about 10 nm, and the second optical layer has a thickness in the first direction of greater than about 20 nm.

In yet another embodiment, a method of forming an optical device is provided. The method includes disposing an optical device substrate on a substrate support in a process volume of a process chamber, the optical device substrate having a first surface; forming a first optical layer on the first surface of the optical device substrate during a first time period when the optical device substrate is on the substrate support, wherein the first optical layer comprises one or more metals in a metal-containing oxide, a metal-containing nitride, or a metal-containing oxynitride, and the first optical layer is formed without an RF-generated plasma over the optical device substrate; and forming a second optical layer with an RF-generated plasma on the first optical layer during a second time period when the optical device substrate is on the substrate support, wherein the first optical layer is disposed between the optical device substrate and the second optical layer, the second optical layer is spaced apart from the optical device substrate in a first direction, the second optical layer comprises a metal-containing oxide, a metal-containing nitride, or a metal-containing oxynitride, the first optical layer has a thickness in the first direction between about 2 nm and about 6 nm, the second optical layer has a thickness in the first direction of greater than about 40 nm, and the first optical layer and the second optical layer are each formed of titanium oxide.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices. More specifically, embodiments described herein relate to an optical device layer stack, an optical device formed from the optical device layer stack, and methods of forming an optical device layer stack.

Figure 1:
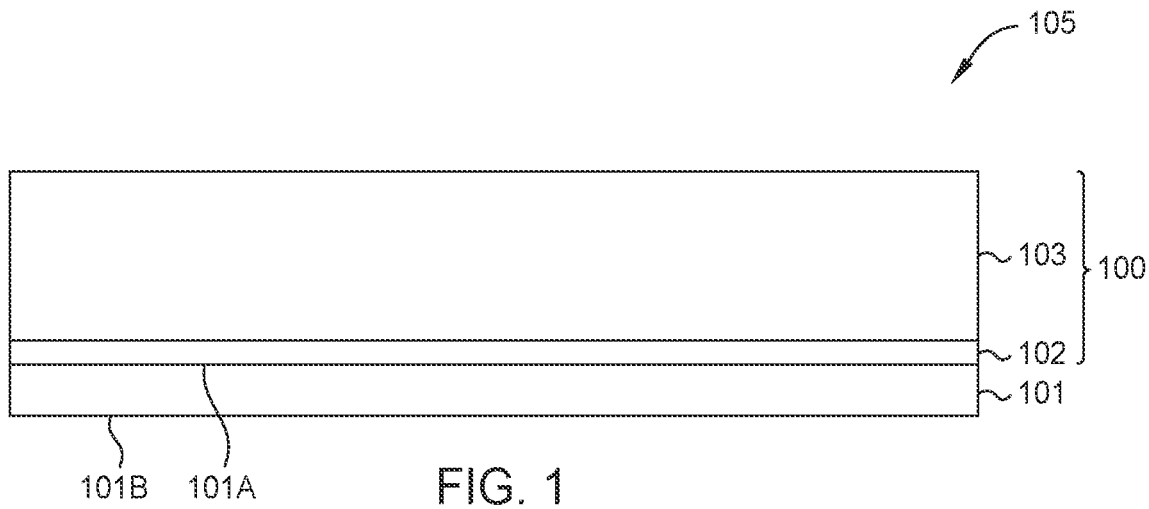
FIG. 1 is a schematic, cross-sectional view of an optical device, according to one embodiment.

FIG. 1 is a schematic, cross-sectional view of an optical device 105, according to one embodiment. The optical device 105 includes an optical device layer stack 100 formed over an optical device substrate 101. The optical device substrate 101 includes a first surface 101A and an opposing second surface 101B. The optical device layer stack 100 is disposed on the first surface 101A of the optical device substrate 101.

The substrate 101 is any suitable optical device substrate. The substrate 101 include from any suitable material, provided that the substrate 101 can adequately transmit light of a specified wavelength or wavelength range and can serve as an adequate support for one or more optical devices formed on the substrate 101. The substrate 101 can be formed of materials including, but not limited to, silicon, silicon oxide, silicon carbide, silica (e.g., fused silica), sapphire, glass, magnesium oxide, diamond, lanthanum oxide, or combinations thereof.

The optical device layer stack 100 includes an interface optical layer 102 (first optical layer) disposed on the substrate 101 and an optical device layer 103 (second optical layer) disposed on the interface optical layer 102. As described in fuller detail below, the interface optical layer 102 is generally formed using milder process conditions compared to the process conditions used to form the optical device layer 103. These milder process conditions can reduce damage to the substrate 101 and improve the optical properties of the optical device 105 compared to similar optical devices formed without the interface optical layer 102.

The interface optical layer 102 includes an oxide, a nitride, or an oxy-nitride of one or more of titanium (Ti), niobium (Nb), silicon (Si), tantalum (Ta), aluminum (Al), chromium (Cr), ruthenium (Ru), hafnium (Hf), magnesium (Mg), zirconium (Zr), vanadium (V), molybdenum (Mo), tungsten (W), manganese (Mn), iron (Fe), cobalt (Co), nickel (Ni), copper (Cu), zinc (Zn), gallium (Ga), tin (Sn), bismuth (Bi), antimony (Sb), gadolinium (Gd), yttrium (Y), or combinations thereof. In some embodiments, the interface optical layer 102 can consist of a single material (e.g., TiO).

The optical device layer 103 includes an oxide, a nitride, or an oxy-nitride of one or more of Ti, Nb, Si, Ta, Al, Cr, Ru, Hf, Mg, Zr, V, Mo, W, Mn, Fe, Co, Ni, Cu, Zn, Ga, Sn, Bi, Sb, Gd, Y, or combinations thereof. In some embodiments, the optical device layer 103 can consist of a single material (e.g., TiO). In one embodiment, the interface optical layer 102 layer and the optical device layer 103 have the same composition. In another embodiment, the interface optical layer 102 layer and the optical device layer 103 have different compositions.

The interface optical layer 102 has a thickness from about an atomic layer (e.g., an atomic layer of TiO) to about 100 nanometers (nm), such as from about 1 nm to about 20 nm, such as about 2 nm to about 6 nm. The optical device layer 103 has a thickness of about 1 nm to about 1000 nm, such as greater than about 20 nm, such as greater than about 40 nm, such as from about 20 to about 200 nm. Although not required, the optical device layer 103 is generally substantially thicker (i.e., in the direction that the optical device layer 103 is spaced apart from the substrate 101) than the interface optical layer 102. For example, in some embodiments, the thickness of the optical device layer 103 is at least two times greater, five times greater, or ten times greater than the thickness of the interface optical layer 102.

The interface optical layer 102 can reduce damage (e.g., plasma damage) to the substrate 101 during deposition of the optical device layer 103. For example, bombardment during physical vapor deposition (PVD) of the optical device layer 103 can damage a substrate 101 resulting in reduced optical device performance, such as higher amounts of optical loss compared to a substrate having less damage. The interface optical layer 102 reduces this damage. Furthermore, the interface optical layer 102 can be optically matched to the substrate 101 and the optical device layer 103 to reduce scattering loss.

Figure 2:
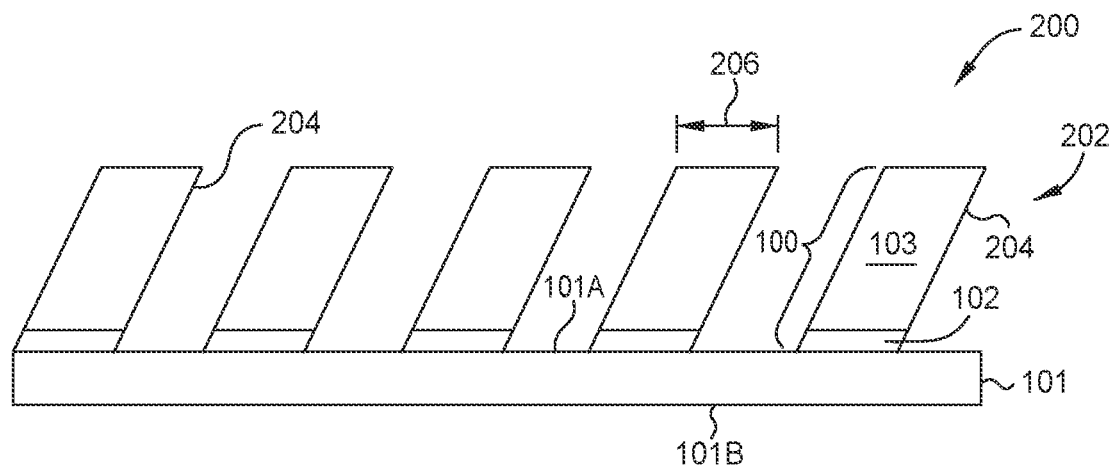
FIG. 2 is a schematic, cross-sectional view of an optical device, according to one embodiment.

FIG. 2 is a schematic, cross-sectional view of an optical device 200, according to one embodiment. The optical device 200 is formed from the optical device layer stack 100. In one embodiment, which can be combined with other embodiments described herein, the optical device 200 is a waveguide combiner, such as an augmented reality waveguide combiner. In another embodiment, which can be combined with other embodiments described herein, the optical device 200 is a flat optical device, such as a meta-surface.

The optical device 200 includes optical device structures 202 disposed on the substrate 101. The optical device structures 202 include sub-micron critical dimensions, e.g., nanosized dimensions, corresponding to the widths 206 of the optical device structures 202. In some embodiments, the optical device structures 202 may be binary structures (not shown) with sidewalls 204 perpendicular to the first surface 101A of the substrate 101. In other embodiments, for example as shown in FIG. 2, the optical device structures 202 may be angled structures with at least one of the sidewalls 204 angled (e.g., non-perpendicular) relative the substrate 101. The optical device structures 202 can be formed from the optical device layer stack 100 via one or more lithography and/or etch processes.

Figure 3:
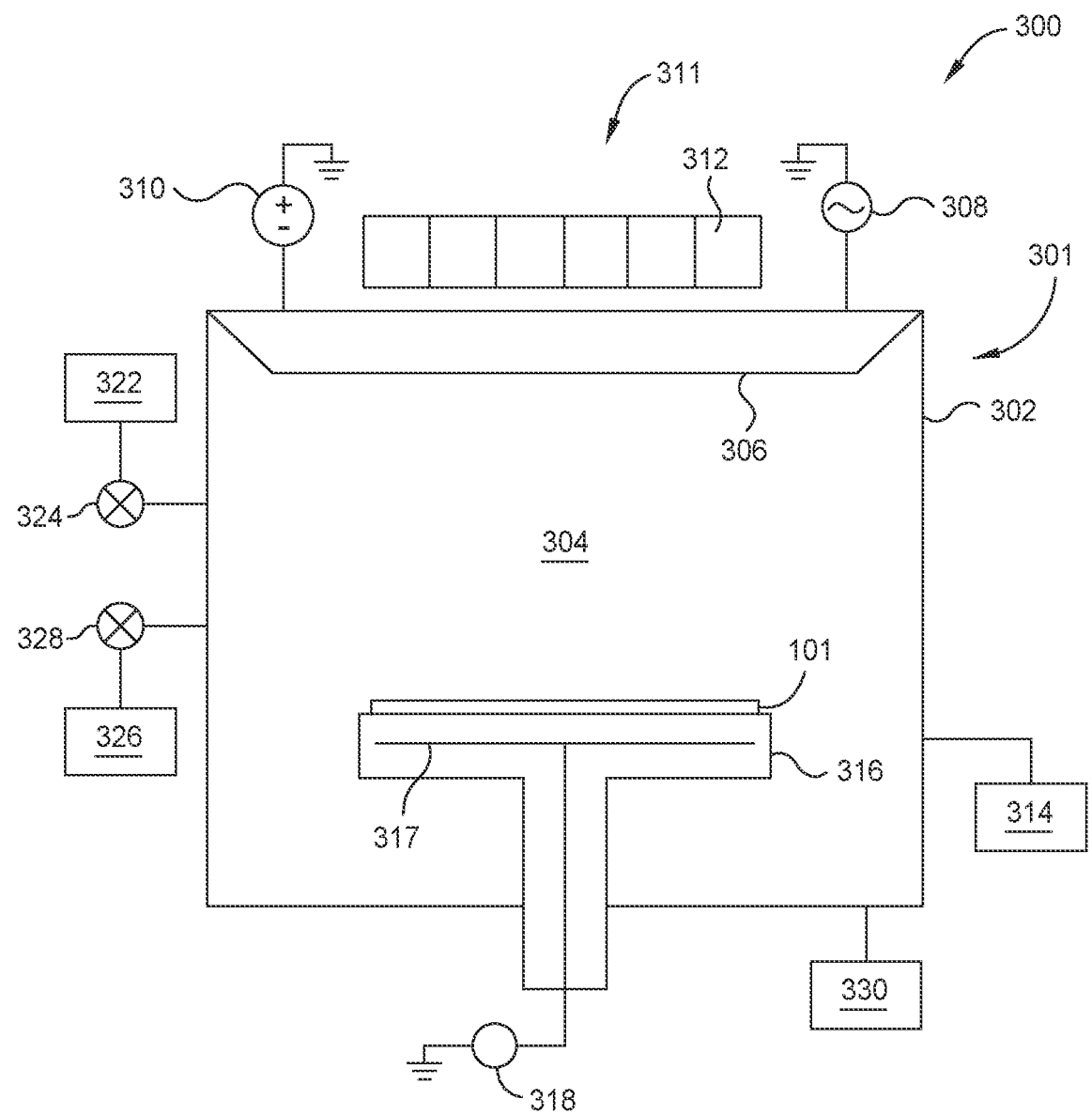
FIG. 3 is a schematic, cross-sectional view of a processing system, according to one embodiment.

FIG. 3 is a schematic, cross-sectional view of a process system 300, according to one embodiment. The processing system 300 includes a process chamber 301. The process system 300 may be used to perform the methods described herein. The process chamber 301 is a physical vapor deposition (PVD) chamber. It is to be understood that the process chamber 301 is an exemplary PVD chamber and other PVD chambers, including PVD chambers from other manufacturers, may be used with or modified to perform the methods of the present disclosure. In some embodiments, a cluster tool (not shown) having at least two process chambers 301 along with the other equipment shown in FIG. 3A may be used to perform the methods described herein. In one embodiment, the cluster tool for performing the methods of forming the optical device layer stack 100 may include a first configuration of the chamber 301 configured for pulsed direct current (DC) PVD and a second configuration of the chamber 301 configured for at least one of radio frequency (RF), DC, or pulsed DC PVD.

The chamber 301 includes a chamber body 302 defining a processing volume 304. The chamber 301 further includes a target 306 disposed in the processing volume 304. The target 306 may be a metal target or a metal-containing target. Examples of a metal target that can be used as the target 306 include one or more of Ti, Nb, Si, Ta, Al, Cr, Ru, Hf, Mg, Zr, V, Mo, W, Mn, Fe, Co, Ni, Cu, Zn, Ga, Sn, Bi, Sb, Gd, Y, or combinations thereof. Examples of a metal-containing target that can be used as the target 306 include an oxide, a nitride, or an oxy-nitride of one or more of Ti, Nb, Si, Ta, Al, Cr, Ru, Hf, Mg, Zr, V, Mo, W, Mn, Fe, Co, Ni, Cu, Zn, Ga, Sn, Bi, Sb, Gd, Y, or combinations thereof. Similarly, oxides, nitrides, or oxy-nitrides of the above metal targets may be formed through reactive sputtering.

The process system 300 can further include an RF power supply 308 and a DC power supply 310. The target 306 can be coupled to the RF power supply 308 and the DC power supply 310. A first configuration of the chamber 301 may include a DC power supply 310. A second configuration of the chamber 301 may include the DC power supply 310 and/or the RF power supply 308. These different configurations can be used independently or when multiple process chambers are used, for example in a cluster tool.

During processing, power can be provided to the target 306. In some embodiments, this power can be used to ignite a plasma composed of one or more of a sputter gas (e.g., argon (Ar)) and a reactive gas, (e.g., an oxygen-containing gas or a nitrogen-containing gas) in the processing volume 304. In some embodiments, the plasma is a capacitively coupled plasma.

The chamber 301 may include a magnetron assembly 311. The magnetron assembly 311 can include a plurality of magnets 312 or electrical coils arranged to provide a magnetic field which extends through the target 306 and into the processing volume 304. The generated magnetic field can increase the plasma density near the target 306 by enabling additional electron-gas atom collisions.

The process system 300 can further include a vacuum source 314. The processing volume 304 is fluidly coupled to a vacuum source 314, such as a vacuum pump to maintain the processing volume 304 at a process pressure and evacuate the sputter gas, reactive gas, and other gases.

The chamber 301 further includes a substrate support 316 disposed in the processing volume 304. The substrate support 316 can include an electrode 317. In some embodiments, the substrate support 316 can be operable to secure (e.g., chuck) the substrate 101 to the support substrate support 316. In some embodiments, the processing system 300 further includes a power source 318. The power source 318 can be coupled to the electrode 317 in the substrate support 316 in order to induce an electrical bias on the substrate 101. The power source 318 may be an RF or DC power source. In other embodiments, a self-bias may form on the substrate 101 during processing.

The process system 300 can further include a sputter gas source 322 and a reactive gas source 326. A sputter gas flow controller 324, such as a mass flow controller (MFC), can be disposed between the sputter gas source 322 and the process volume 304 to control a flow of the sputter gas (e.g., argon) from the sputter gas source 322 to the processing volume 304. A reactive gas flow controller 328, such as an MFC, can be disposed between a reactive gas source 326 and the process volume 304 to control a flow of the reactive gas (e.g., oxygen and/or nitrogen) from the reactive gas source 326 to the processing volume 304. A controller 330 is coupled to the chamber 301 and configured to control aspects of the process system 300 during processing, such as during the methods of forming the optical device layer stack 100.

Figure 4:
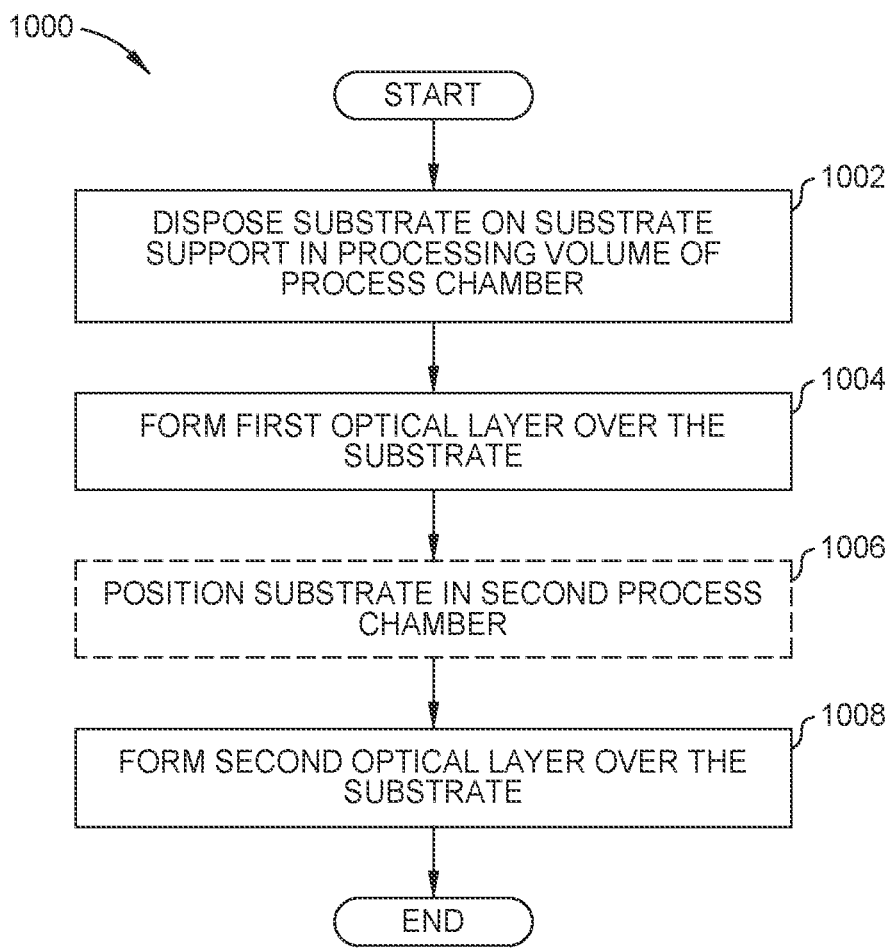
FIG. 4 is a process flow diagram of a method of forming the optical device shown in FIG. 1, according to one embodiment.

FIG. 4 is a process flow diagram of a method 1000 of forming the optical device 105 shown in FIG. 1, according to one embodiment. The method 1000 can be performed using the processing system 300 described above in reference to FIG. 3.

The method 1000 begins at block 1002. At block 1002, the optical device substrate 101 is positioned on the substrate support 316 in the process chamber 301.

At block 1004, the interface optical layer 102 (first optical layer) is formed over the substrate 101, such as directly on the first surface 101A of the substrate 101, during a first time period, for example using a PVD process. The interface optical layer 102 can be formed in a variety of ways using conditions that are milder than the conditions used to form the optical device layer 103. Due to the relative differences between forming the layers 102, 103, these differences are discussed in further detail below after providing a description of an exemplary process to form the optical device layer 103.

At block 1006, the optical device substrate 101 is optionally positioned on a second substrate support 316 in a second process volume 304 in a second process chamber 301 (not shown), for example in a cluster tool (not shown) that includes at least two process chambers 301. In some embodiments, the substrate 101 can remain on the substrate support 316 in the process chamber 301 shown in FIG. 3.

At block 1008, the optical device layer 103 (second optical layer) is formed over the interface optical layer 102 during a second time period, for example using a PVD process. The second time period can begin after the first time period (i.e., the time period when the interface optical layer 102 was formed) ends. The optical device layer 103 is generally formed by physical vapor deposition in which the target 306 is sputtered by a sputter gas (e.g., argon) provided from the sputter gas source 322. When a metal material (i.e., a material not including oxygen and/or nitrogen) is used as the target 306, then one or more reactive gases (e.g., oxygen and/or nitrogen) can be provided from reactive gas source 326 to the process volume 304 during block 1008. In other embodiments, the target 306 can include oxygen and/or nitrogen and in such embodiments, oxygen and/or nitrogen may not be provided to the process volume 304.

Although not required, the optical device layer 103 is generally formed by generating a RF plasma in the process volume 304. For example, RF power can be provided from the RF power supply 308 to the target 306. The RF power at the target 306 can be coupled (e.g., capacitively or inductively coupled depending on the process chamber being used) through to the substrate support 316 which can be grounded. In some embodiments, a DC bias can be applied to the electrode 317 in the substrate support 316. As mentioned above using an RF plasma to deposit an optical layer, such as the optical device layer 103 can often damage a substrate when the optical layer is deposited directly on the substrate. However, here the interface optical layer 102 is deposited on the first surface 101A of the optical device substrate 101, so that the optical device layer 103 is deposited on the interface optical layer 102.

As mentioned above, the interface optical layer 102 is generally formed using milder process conditions compared to the process conditions used to form the optical device layer 103. These milder process conditions can reduce damage to the substrate 101 and improve the optical properties of the optical device 105 compared to similar optical devices formed without the interface optical layer 102. The following provides some examples of milder process conditions that can be used to form the interface optical layer 102 when compared to the conditions used to perform the optical device layer 103.

In a first example of milder process conditions, the interface optical layer 102 can be formed at a substantially lower temperature than a temperature at which the optical device layer 103 is formed. For example, in one embodiment, the interface optical layer 102 can be formed at a temperature less than 50° C. (e.g., room temperature) and the optical device layer 103 can be formed at a temperature greater than 300° C., such as 425° C. These temperatures can refer to a temperature of the substrate 101 on which the corresponding layer 102, 103 is being formed during the respective time periods.

In another example of milder process conditions, the interface optical layer 102 can be formed by applying an RF power to the target 306 at a lower power during the first time period compared to a corresponding RF power applied to the target 306 having a higher power during the second time period. For example, in some embodiments, the RF power during the first time period of block 1004 is at least 25% lower, 50% lower, or 75% lower than the RF power applied during the second time period of block 1008.

In another example of milder process conditions, the interface optical layer 102 can be formed by applying a pulsed DC voltage between the target 306 and the substrate support 316 during the first time period compared to a corresponding RF power applied to the target 306 during the second time period. The DC power can be pulsed during the first time period at frequency from about 25 kHz to about 600 kHz, such as from about 50 kHz to about 300 kHz. The duty cycle of the pulse signal can be from about 0.5% to about 80%, such as from about 1% to about 40%. In some embodiments, the pulsing of the DC voltage can be at a frequency that is lower than radio frequencies. A pulsed DC voltage can often cause less damage to a substrate surface than a corresponding RF voltage.

In another example of milder process conditions, the interface optical layer 102 can be formed by applying a lower DC bias to the electrode 317 in the substrate support 316 during the first time period relative to the DC bias applied to the electrode 317 in the substrate support 316 during the second time period to form the optical device layer 103. For example, in some embodiments, the DC bias (e.g., the DC bias voltage) can be lower by at least 10 percent, such as by at least 30 percent, such as by at least 60 percent, such as by at least 90 percent relative to the DC bias applied to the electrode 317 during the second time period. The lower DC bias can slow the attraction of particles (e.g., ions and radicals) in the plasma towards the substrate 101 resulting in less damage to the substrate 101 relative to when a higher bias voltage is applied.

In another example of milder process conditions, the interface optical layer 102 can be formed by depositing the interface optical layer in different stages. For example, in one embodiment, a metal film (e.g., metal only film) can be formed during a first portion of the first time period without oxygen and/or nitrogen being provided from the reactive gas source 326 or the target 306, and then at a later time during a second portion of the first time period one or more reactant gases (e.g., oxygen and/or nitrogen) can be provided to the process volume, so that the metal film can be transformed into a metal-containing oxide, nitride, or oxynitride. By forming a metal-only film first, there can be less interaction between the substrate material and the oxygen/or nitrogen. For example, a substrate containing silicon can interact with oxygen provided to the process volume. This interaction can result in silicon atoms ending up in the interface optical layer 102 adjacent the substrate, which leads to a less uniform interface optical layer 102. This reduced uniformity can contribute to optical loss. Therefore, by forming a metal-only film first before providing the reactant gas to the process volume, interaction between the reactant gas (e.g., oxygen and/or nitrogen) and the substrate can be reduced, and a more uniform interface optical layer 102 can be formed.

A metal film without oxygen or nitrogen in the film can be formed according to a variety of methods including a PVD process, an electron beam deposition, a thermal deposition, an atomic layer deposition (ALD), or another process. Depending on the gases provided to the process volume, a metal film formed by ALD may coincidentally include oxygen or nitrogen before the metal film is transformed into a metal-containing oxide, nitride, or oxynitride. For example, the metal may be bonded to a volatile compound that includes oxygen and/or nitrogen, and this compound can be removed when oxygen and/or nitrogen is provided to the process volume 304 during the second portion of the first time period.

Forming the interface optical layer 102 in stages as described in this paragraph may also include repeating one or more portions of the process. For example, an ALD process may be repeated numerous times until a specified thickness is achieved. Furthermore, in one embodiment, a metal film (e.g., a titanium film) is formed during the first time period at block 1004 and then is subsequently transformed into an oxide, nitride, or oxynitride when the optical device layer 103 is being formed. For example, in such embodiments, the interface optical layer 102 may be thin enough that the oxygen and/or nitrogen provided to form the optical device layer 103 may be enough to transform the interface optical layer 102 into an oxide and/or nitride.

In another example of milder process conditions, the interface optical layer 102 can be formed by using different gas flows and/or targets than the gas flows and/or targets used during the second time period to form the optical device layer 103. For example, in some embodiments, a first material (e.g., SiN) used as the interface optical layer 102 may result in less damage to a given substrate than if the material (e.g., TiO) used as the optical device layer 103 were deposited directly on the substrate. In another example, flowrates of one or more gases (e.g., sputter and/or reactant gases) provided to the process volume can be reduced, which can result in less damage to the substrate 101. For example, in one embodiment, an interface optical layer 102 of titanium oxide can be formed using flowrates of 5 sccm of argon and 120 sccm of oxygen while an optical device layer 103 of titanium oxide can be formed using flowrates of 5 sccm of argon and 8 sccm of oxygen. Thus, having the sputter gas (e.g., argon) be a lower proportion of the gas provided to the process volume 304 can be one method of forming an optical layer under milder conditions that damages the substrate less than when compared to when the sputter gas is a higher proportion of the gas provided to the process volume 304.

The examples above are not an exhaustive list of methods of achieving milder process conditions for forming the interface optical layer 102. Furthermore, many of examples of milder process conditions noted above can be combined to potentially further reduce damage to the substrate 101 when interface optical layer 102 is formed on the substrate 101 compared to if the optical device layer 103 were formed directly on the substrate 101. For example, in one embodiment, the interface optical layer 102 can be formed using a pulsed DC voltage that is also at a lower power than the corresponding RF voltage used to form the optical device layer 103. In another embodiment, the interface optical layer 102 can be formed using a lower DC bias applied to the electrode 317 in the substrate support 316 and at a lower substrate temperature compared to when the optical device layer 103 is formed.

Although the optical device layer 103 is generally described as being formed by applying an RF voltage to the target 306, this is not required. For example, in some embodiments, the optical device layer 103 can be formed without an RF voltage being applied to the target 306 (e.g., using a pulsed DC signal instead or no voltage). However, even when an RF voltage is not applied to the target 306 when the optical device layer 103 is formed, the process conditions used to form the interface optical layer 102 are still milder in at least one of the ways described above (e.g., lower temperature, DC bias etc.), so that less damage is caused to the substrate 101 when the interface optical layer 102 is formed on the substrate 101 compared to if the optical device layer 103 were formed directly on the substrate 101 without the interface layer 102.

In another method, multiple interface optical layers 102 may be formed over the substrate 101. Each interface optical layer 102 of these multiple interface optical layers can have a thickness similar to the thickness described above for the interface optical layer 102, such as from about 2 nm and about 6 nm. For example, in one embodiment, a first interface optical layer of: silicon nitride may be formed directly on the substrate 101, then a second interface optical layer of titanium oxide can be formed on the first interface optical layer, and then a layer of titanium oxide can be formed as the optical device layer 103 directly on the second interface optical layer. In this example, the first interface layer of silicon nitride may be better matched to the substrate 101 (e.g., better optically matched for refractive index or other properties), and the second interface layer formed of titanium oxide can be better matched (e.g., better optically matched for refractive index or other properties) to the optical device layer 103 formed of titanium oxide. These two interface optical layers can allow for a smoother transition for light passing through the substrate 101, two interface layers, and the optical device layer 103 compared to some embodiments that only include one interface optical layer 102. Additionally or alternatively, each of the multiple interface optical layers 102 may have the same or similar composition, but be formed at different process conditions, such as increasing RF power. In yet another embodiment, which may be combined with other embodiments herein, one or more interface optical layers 102 may include ramped process conditions, such that the process condition changes (e.g., increases) as the thickness of the interface optical layer 102 increases.

Notably, the method 1000 described above can provide substantial benefits even when the same material (e.g., TiO) is used as the interface optical layer 102 and the optical device layer 103, such that the optical device layer stack 100 consists of a single material. Optical loss can be reduced by a substantial amount (e.g., 50% or more) when an optical device is formed using the interface optical layer 102 compared to the same optical device formed without the interface optical layer 102. Overall, by forming an interface optical layer 102 over the substrate 101 using one or more of the milder process conditions described above damage to the substrate 101 can be reduced when compared to an optical device having the optical device layer 103 formed directly on the substrate 101. By avoiding this damage, the optical devices formed using the methods described herein can provide higher level of optical performance with less optical loss and light scattering.

While the foregoing is directed to examples of the present disclosure, other and further examples of the disclosure may be devised without departing from the basic scope thereof, and the scope thereof is determined by the claims that follow.

What is claimed is:

1. A method of forming an optical device, the method comprising:
   disposing an optical device substrate on a substrate support in a process volume of a process chamber, the optical device substrate having a first surface;
   forming a first optical layer on the first surface of the optical device substrate during a first time period when the optical device substrate is on the substrate support, wherein
      the first optical layer comprises a metal-containing oxide, a metal-containing nitride, or a metal-containing oxynitride, and
      the first optical layer is formed without an RF-generated plasma over the optical device substrate;
   forming a second optical layer with an RF-generated plasma on and in contact with the first optical layer during a second time period when the optical device substrate is on the substrate support, wherein
      the first optical layer is disposed between the optical device substrate and the second optical layer,
      the second optical layer is spaced apart from the optical device substrate in a first direction,
      the second optical layer comprises a metal-containing oxide, a metal-containing nitride, or a metal-containing oxynitride,
      the first optical layer and the second optical layer consist of a single metal and one or more of oxygen and nitrogen,
      the single metal is selected from the group consisting of titanium (Ti), niobium (Nb), silicon (Si), tantalum (Ta), aluminum (Al), chromium (Cr), ruthenium (Ru), hafnium (Hf), magnesium (Mg), zirconium (Zr), molybdenum (Mo), tungsten (W), manganese (Mn), iron (Fe), cobalt (Co), nickel (Ni), copper (Cu), zinc (Zn), gallium (Ga), tin (Sn), bismuth (Bi), antimony (Sb), gadolinium (Gd), and yttrium (Y), the first optical layer has a thickness in the first direction between an atomic layer and about 10 nm, and
the second optical layer has a thickness in the first direction of greater than about 20 nm; and
forming a plurality of optical device structures over the substrate, the plurality of optical device structures spaced apart from each other in a second direction that is perpendicular to the first direction, wherein each optical device structure includes a portion of the first optical layer and a portion of the second optical layer.

2. The method of claim 1, wherein the first optical layer and the second optical layer comprise a same material.

3. The method of claim 2, wherein the first optical layer and the second optical layer are each formed of titanium oxide.

4. The method of claim 1, wherein the thickness of the second optical layer in the first direction is at least ten times greater than the thickness of the first optical layer in the first direction.

5. The method of claim 1, wherein a temperature of the substrate during the first time period is less than 50° C. and the temperature of the substrate during the second time period is greater than 300° C.

6. The method of claim 1, wherein
a target containing a metal in the first optical layer is positioned in the process volume,
a pulsed direct current voltage is applied between the target and the substrate support during the first time period, and
the pulsed direct current voltage is pulsed during the first time period at frequency from about 50 kHz to about 300 KHz.

7. The method of claim 1, wherein the first optical layer and the second optical layer consist of a single material that is the same material in both the first optical layer and the second optical layer.

8. The method of claim 1, wherein forming the first optical layer comprises:
depositing a metal-containing film in an absence of oxygen and nitrogen during a first portion of the first time period, and
providing one or more of oxygen and nitrogen to the process volume during a second portion of the first time period, wherein the second portion of the first time period occurs after the first portion of the first time period.

9. The method of claim 1, wherein each optical device structure of the plurality of optical device structures has a sub-micron width in the second direction.

10. A method of forming an optical device, the method comprising:
disposing an optical device substrate on a first substrate support in a first process volume of a first process chamber, the optical device substrate having a first surface;
forming a first optical layer on the first surface of the optical device substrate during a first time period when the optical device substrate is on the first substrate support in the first process volume, wherein
the first optical layer comprises a metal-containing oxide, a metal-containing nitride, or a metal-containing oxynitride, and
the first optical layer is formed without an RF-generated plasma over the optical device substrate;
disposing the optical device substrate on a second substrate support in a second process volume of a second process chamber; and forming a second optical layer with an RF-generated plasma on an in contact with the first optical layer during a second time period when the optical device substrate is on the second substrate support, wherein
the first optical layer is disposed between the optical device substrate and the second optical layer,
the second optical layer is spaced apart from the optical device substrate in a first direction,
the second optical layer comprises a metal-containing oxide, a metal-containing nitride, or a metal-containing oxynitride,
the first optical layer and the second optical layer consist of a single metal and one or more of oxygen and nitrogen,
the single metal is selected from the group consisting of titanium (Ti), niobium (Nb), silicon (Si), tantalum (Ta), aluminum (Al), chromium (Cr), ruthenium (Ru), hafnium (Hf), magnesium (Mg), zirconium (Zr), molybdenum (Mo), tungsten (W), manganese (Mn), iron (Fe), cobalt (Co), nickel (Ni), copper (Cu), zinc (Zn), gallium (Ga), tin (Sn), bismuth (Bi), antimony (Sb), gadolinium (Gd), and yttrium (Y),
the first optical layer has a thickness in the first direction between an atomic layer and about 10 nm, and
the second optical layer has a thickness in the first direction of greater than about 20 nm; and
forming a plurality of optical device structures over the substrate, the plurality of optical device structures spaced apart from each other in a second direction that is perpendicular to the first direction, wherein each optical device structure includes a portion of the first optical layer and a portion of the second optical layer.

11. The method of claim 10, wherein the first optical layer and the second optical layer comprise a same material.

12. The method of claim 11, wherein the first optical layer and the second optical layer are each formed of titanium oxide.

13. The method of claim 10, wherein
the thickness of the second optical layer in the first direction is at least ten times greater than the thickness of the first optical layer in the first direction, and
the thickness of the first optical layer is from about 2 nm to about 6 nm.

14. The method of claim 10, wherein a temperature of the substrate during the first time period is less than 50° C. and the temperature of the substrate during the second time period is greater than 300°C.

15. The method of claim 10, wherein
a target containing a metal in the first optical layer is positioned in the first process volume,
a direct current voltage is applied between the target and the first substrate support during the first time period, and
the direct current voltage is pulsed on and off during the first time period at frequency from 50 kHz to about 300 KHz.

16. The method of claim 10, wherein the first optical layer and the second optical layer consist of a single material that is the same material in both the first optical layer and the second optical layer.

17. The method of claim 10, wherein forming the first optical layer comprises:
depositing a metal-containing film in an absence of oxygen and nitrogen during a first portion of the first time period, and
providing one or more of oxygen and nitrogen to the first process volume during a second portion of the first time period, wherein the second portion of the first time period occurs after the first portion of the first time period.

18. The method of claim 10, wherein each optical device structure of the plurality of optical device structures has a sub-micron width in the second direction.

19. A method of forming an optical device, the method comprising:

disposing an optical device substrate on a substrate support in a process volume of a process chamber, the optical device substrate having a first surface;

forming a first optical layer on the first surface of the optical device substrate during a first time period when the optical device substrate is on the substrate support, wherein the first optical layer comprises a metal-containing oxide, a metal-containing nitride, or a metal-containing oxynitride, and the first optical layer is formed without an RF-generated plasma over the optical device substrate;

forming a second optical layer with an RF-generated plasma on and in contact with the first optical layer during a second time period when the optical device substrate is on the substrate support, wherein the first optical layer is disposed between the optical device substrate and the second optical layer, the second optical layer is spaced apart from the optical device substrate in a first direction, the second optical layer comprises a metal-containing oxide, a metal-containing nitride, or a metal-containing oxynitride, the first optical layer and the second optical layer consist of a single metal and one or more of oxygen and nitrogen, the single metal is selected from the group consisting of titanium (Ti), niobium (Nb), silicon (Si), tantalum (Ta), aluminum (Al), chromium (Cr), ruthenium (Ru), hafnium (Hf), magnesium (Mg), zirconium (Zr), molybdenum (Mo), tungsten (W), manganese (Mn), iron (Fe), cobalt (Co), nickel (Ni), copper (Cu), zinc (Zn), gallium (Ga), tin (Sn), bismuth (Bi), antimony (Sb), gadolinium (Gd), and yttrium (Y), the first optical layer has a thickness in the first direction between about 2 nm and about 6 nm, the second optical layer has a thickness in the first direction of greater than about 40 nm, and the first optical layer and the second optical layer are each formed of titanium oxide; and forming a plurality of optical device structures over the substrate, the plurality of optical device structures spaced apart from each other in a second direction that is perpendicular to the first direction, wherein each optical device structure includes a portion of the first optical layer and a portion of the second optical layer.

20. The method of claim 19, wherein each optical device structure of the plurality of optical device structures has a sub-micron width in the second direction.

* * * * *